US011043726B2

(12) United States Patent
Lo Hine Tong et al.

(10) Patent No.: US 11,043,726 B2
(45) Date of Patent: Jun. 22, 2021

(54) RADIO FREQUENCY INTERCONNECTION DEVICE

(71) Applicant: Interdigital Madison Patent Holdings, SAS, Paris (FR)

(72) Inventors: Dominique Lo Hine Tong, Rennes (FR); Anthony Aubin, Bourgbarre (FR); Jean-Marc Le Foulgoc, Bourgbarre (FR)

(73) Assignee: Interdigital Madison Patent Holdings, SAS, Paris (FR)

( * ) Notice: Subject to any disclaimer, the term of this patent is extended or adjusted under 35 U.S.C. 154(b) by 32 days.

(21) Appl. No.: 16/314,435

(22) PCT Filed: Jun. 27, 2017

(86) PCT No.: PCT/EP2017/065917
§ 371 (c)(1),
(2) Date: Dec. 30, 2018

(87) PCT Pub. No.: WO2018/002092
PCT Pub. Date: Jan. 4, 2018

(65) Prior Publication Data
US 2019/0319329 A1    Oct. 17, 2019

(30) Foreign Application Priority Data

Jun. 30, 2016 (EP) ..................... 16305824

(51) Int. Cl.
*H01P 5/02* (2006.01)
*H05K 1/11* (2006.01)
(Continued)

(52) U.S. Cl.
CPC ............... *H01P 5/02* (2013.01); *H01P 1/203* (2013.01); *H01P 3/08* (2013.01); *H05K 1/0237* (2013.01);
(Continued)

(58) Field of Classification Search
CPC .. H05K 1/11; H05K 1/14; H01P 1/203; H01P 5/02
(Continued)

(56) References Cited

U.S. PATENT DOCUMENTS 3,764,955 A * 10/1973 Ward ................. H05K 3/366
439/377
5,441,430 A    8/1995 Seidler
(Continued)

FOREIGN PATENT DOCUMENTS

CN        1249856 C     4/2006
CN      101521313 A     9/2009
(Continued)

OTHER PUBLICATIONS

Anonymous, "Part 11: Wireless LAN Medium Access Control (MAC) and Physical Layer (PHY) specifications", IEEE Standard 802.11-2012, Information Technology—Telecommunications and information exchange between systems—Local and metropolitan area networks—Specific requirements, IEEE, New York, NY, USA, Jun. 26, 1997, pp. 1-459.
(Continued)

*Primary Examiner* — Rakesh B Patel
(74) *Attorney, Agent, or Firm* — Invention Mine LLC (57) ABSTRACT

An interconnection system is described including a first printed circuit board, the first printed circuit board including a first portion of a filter, the filter used to communicate a signal between the first printed circuit board and a second printed circuit board, and a mechanical structure for coupling the signal between the first printed circuit board and the second printed circuit board, the second printed circuit board being oriented at an angle with respect to the first printed circuit board.

26 Claims, 11 Drawing Sheets

(51) Int. Cl.
*H05K 1/14* (2006.01)
*H01P 1/203* (2006.01)
*H01P 3/08* (2006.01)
*H05K 1/02* (2006.01)

(52) U.S. Cl.
CPC ............. *H05K 1/11* (2013.01); *H05K 1/14* (2013.01); *H05K 2201/044* (2013.01)

(58) Field of Classification Search
USPC .......................................... 361/803; 333/185
See application file for complete search history.

(56) References Cited

U.S. PATENT DOCUMENTS

| | | | |
|---|---|---|---|
| 5,523,768 | A | 6/1996 | Hemmie et al. |
| 7,221,159 | B2 | 5/2007 | Griffiths et al. |
| 7,804,695 | B2 | 9/2010 | Thevenard |
| 2004/0072477 | A1 | 4/2004 | Templin |
| 2005/0042941 | A1 | 2/2005 | Keating et al. |
| 2006/0170518 | A1 | 8/2006 | Chang |
| 2009/0213562 | A1 | 8/2009 | Thevenard et al. |
| 2014/0099993 | A1 | 4/2014 | Wong et al. |
| 2016/0043484 | A1 | 2/2016 | Brodsky |
| 2016/0072189 | A1 | 3/2016 | Lo Hine Tong |

FOREIGN PATENT DOCUMENTS

| | | |
|---|---|---|
| CN | 202333088 U | 7/2012 |
| EP | 2096904 A1 | 9/2009 |
| FR | 3018660 A1 | 9/2015 |
| WO | 0241453 A1 | 5/2002 |

OTHER PUBLICATIONS

Chen et al., "Printed Circuit Board Bandpass Filters with Octave Bandwidth and Very Wide Upper Stopband", IEICE Transactions on Electronics, vol. 90-C, No. 12, Dec. 2007, pp. 2205-2211.

\* cited by examiner

FIG. 1

PRIOR ART

FIG. 2

PRIOR ART

PRIOR ART

FIG. 5

PRIOR ART

FIG. 6

PRIOR ART

FIG. 17

RADIO FREQUENCY INTERCONNECTION DEVICE

This application claims the benefit, under 35 U.S.C. § 365 of International Application PCT/EP2017/065917, filed Jun. 27, 2017, which was published in accordance with PCT Article 21(2) on Jan. 4, 2018, in English, and which claims the benefit of European Patent Application No. 16305824.1, filed Jun. 30, 2016.

FIELD

The proposed apparatus (device) is directed to a radio frequency interconnection device that enables the interconnection of two circuit boards (for example, main printed circuit boards PCBs)) arranged, for example, perpendicularly.

BACKGROUND

This section is intended to introduce the reader to various aspects of art, which may be related to the present embodiments that are described below. This discussion is believed to be helpful in providing the reader with background information to facilitate a better understanding of the various aspects of the present disclosure. Accordingly, it should be understood that these statements are to be read in this light.

Figure 1:
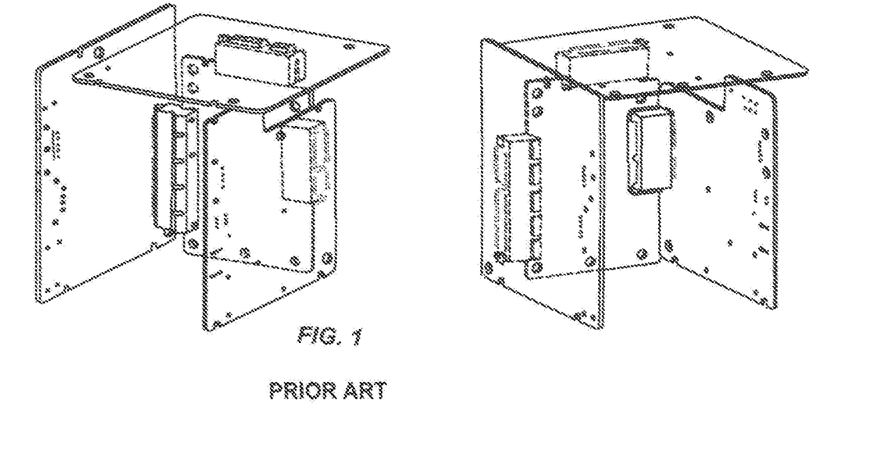
FIG. 1 depicts a device having several circuit boards that are perpendicular to each other and are interconnected using conventional Peripheral Component Interconnect express (PCIe) connectors.

FIG. 1 shows the mechanical architecture of a device that contains four circuit boards interconnected to each other. In FIG. 1, the Wi-Fi and the DVB-T front-end boards are interconnected to the circuit board through an interconnected board and by using three Peripheral Component Interconnect express (PCIe) connectors. FIG. 1, in particular, depicts a device having several circuit boards that are perpendicular to each other and are interconnected using conventional Peripheral Component Interconnect express (PCIe) connectors.

Figure 2:
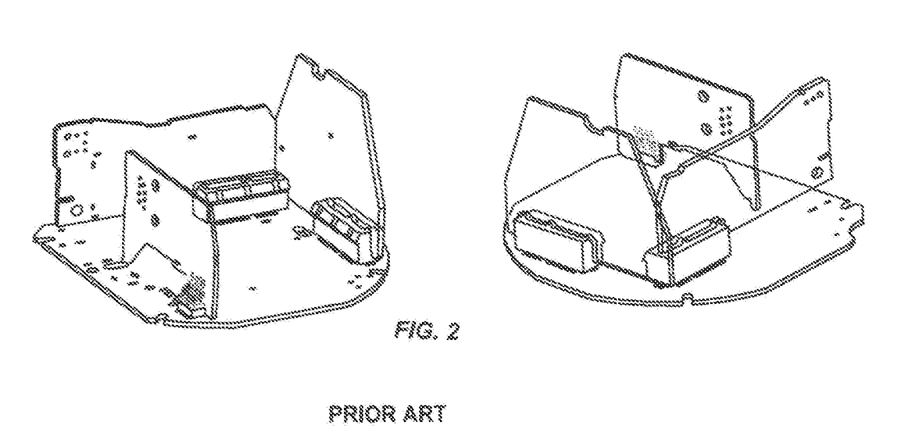
FIG. 2 shows a set top box (STB) having several circuit boards that are perpendicular to each other and are interconnected using conventional Peripheral Component Interconnect express (PCIe) connectors.

FIG. 2 shows a set top box having several circuit boards that are perpendicular to each other and are interconnected using conventional Peripheral Component Interconnect express (PCIe) connectors. In FIG. 2, the set top box also includes four circuit boards. A circuit board is disposed horizontally and the three other circuit boards (Wi-Fi, front-end and interface boards) are perpendicular to the circuit board. The board-to-board interconnection between the circuit boards is also accomplished in FIG. 2 by using Peripheral Component Interconnect express connectors.

As known in the art, common multi-pins connectors, such as Peripheral Component Interconnect express connectors, cannot be used to transmit radio frequency (RF) signals because of the inherent high impedance mismatching that impairs the integrity of the radio frequency signals. In the radio frequency field, to avoid impedance mismatching when transmitting a signal between circuit boards (board-to-board (B2B)), alternative solutions must be adopted.

Figure 3:
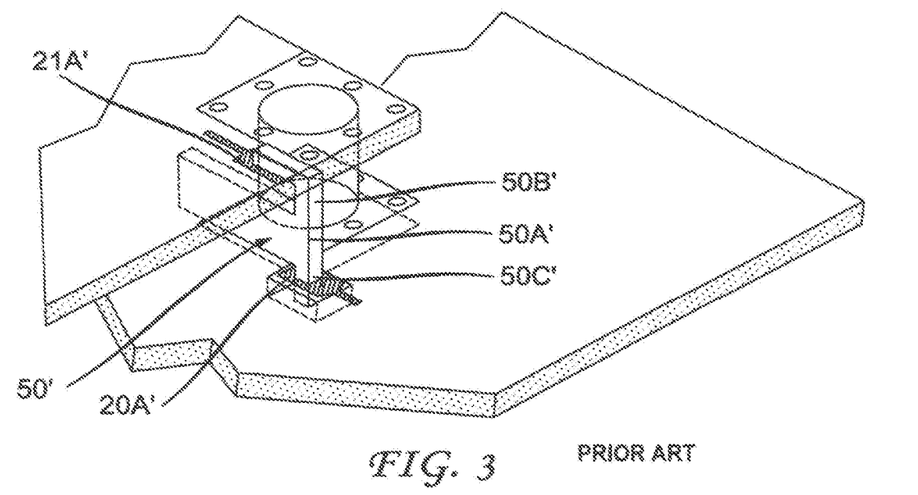
FIG. 3 depicts two circuit boards that are arranged parallel to each other and which are interconnected using a metal part, an element of which is coupled to the board-to-board (B2B) grounding screw.

FIG. 3 depicts two circuit boards that are arranged parallel to each other and which are interconnected using a metal part, an element of which is electromagnetically coupled to the board-to-board (circuit board to circuit board) grounding screw. The electromagnetic coupling to the grounding screw ensures wideband impedance matching.

When two circuit boards are disposed orthogonally to each other, several state-of-the-art solutions can be used to transmit circuit board to circuit board (B2B) radio frequency signals. The most common interconnection solution is the use of a coaxial cable. Indeed, with the drastic cost constraints in terms of design of new electronic devices, using a coaxial cable is prohibitively costly.

Figure 4:
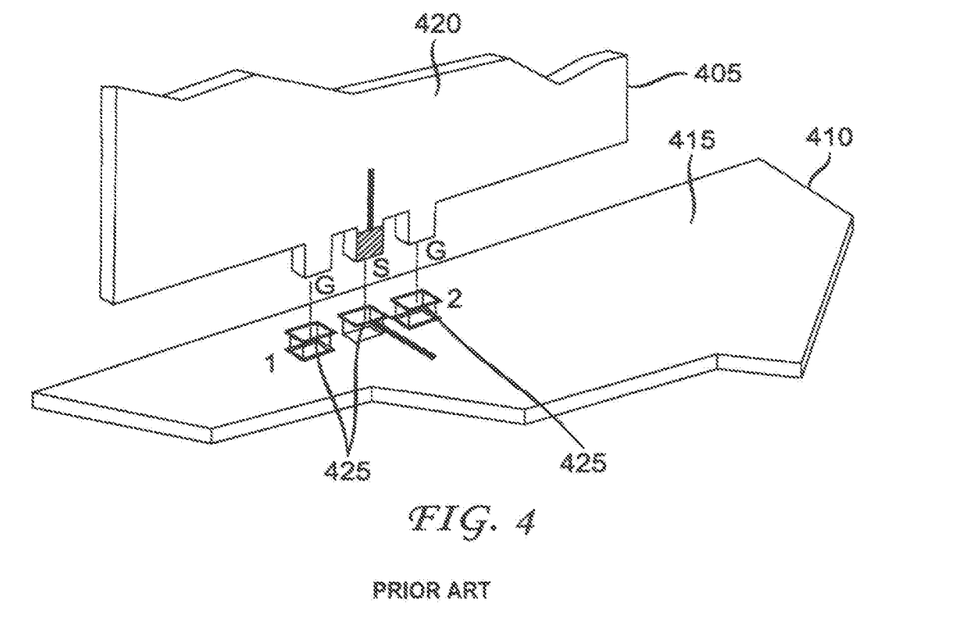
FIG. 4 shows two circuit boards that are perpendicular to each other and which are interconnected by pins integrated into the vertical circuit board.

FIG. 4 shows two circuit boards that are perpendicular to each other and which are interconnected by pins (G, S, G) integrated into the vertical circuit board 405. The pins (G, S, G) of the vertical circuit board fit into holes 425 of the horizontal circuit board 410. The vertical circuit board has a ground plane 420 and the horizontal circuit board also has a ground plane 415. Using pins integrated to the vertical circuit board can also be applied to circuit board to circuit board (board-to-board (B2B) interconnection of radio frequency signals. FIG. 4 shows an example of circuit boards perpendicular to each other, where the vertical board 405 contains three pins (one signal pin and two ground pins (G, S, G)). The drawback to using pins on the vertical circuit board 405 to interconnect radio frequency signals between the vertical circuit board 405 and the horizontal circuit board 410 is related to the feasibility of high volume production and at low cost. Indeed, since the ground pins are required to be very close to the signal pin in order to minimize impedance mismatching, this requirement is incompatible with the low cost technologies and materials, and the large fabrication tolerances used for set top box manufacturing.

Figure 5:
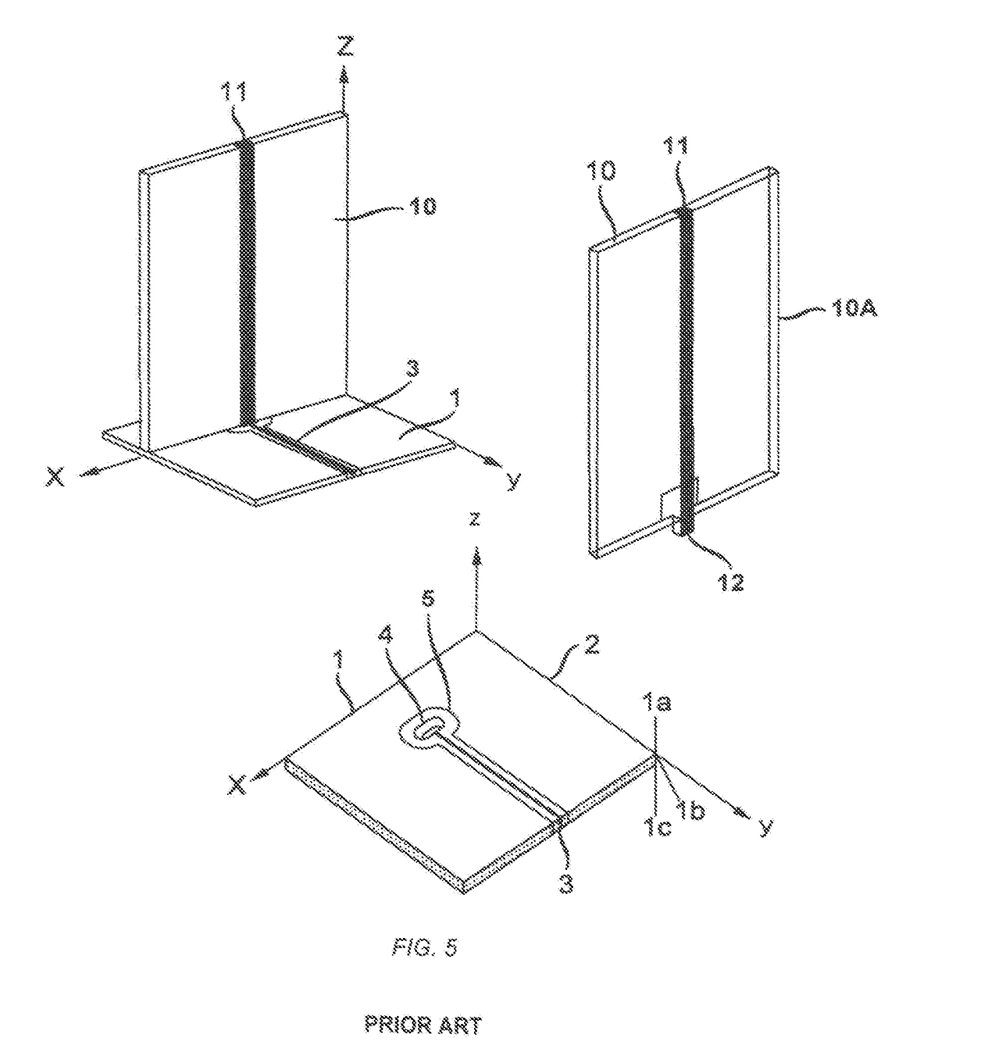
FIG. 5 depicts two circuit boards interconnected using a single pin and having a filtering pattern that enables a wideband interconnect.

FIG. 5 depicts two circuit boards interconnected using a single pin 12 and having a filtering pattern that enables a wideband interconnect. The use of a single circuit board pin 12 with a specific filtering pattern to enable a wideband interconnection between two perpendicular circuit boards (10, 1) requires a manual soldering of the ground and signal patterns.

Figure 6:
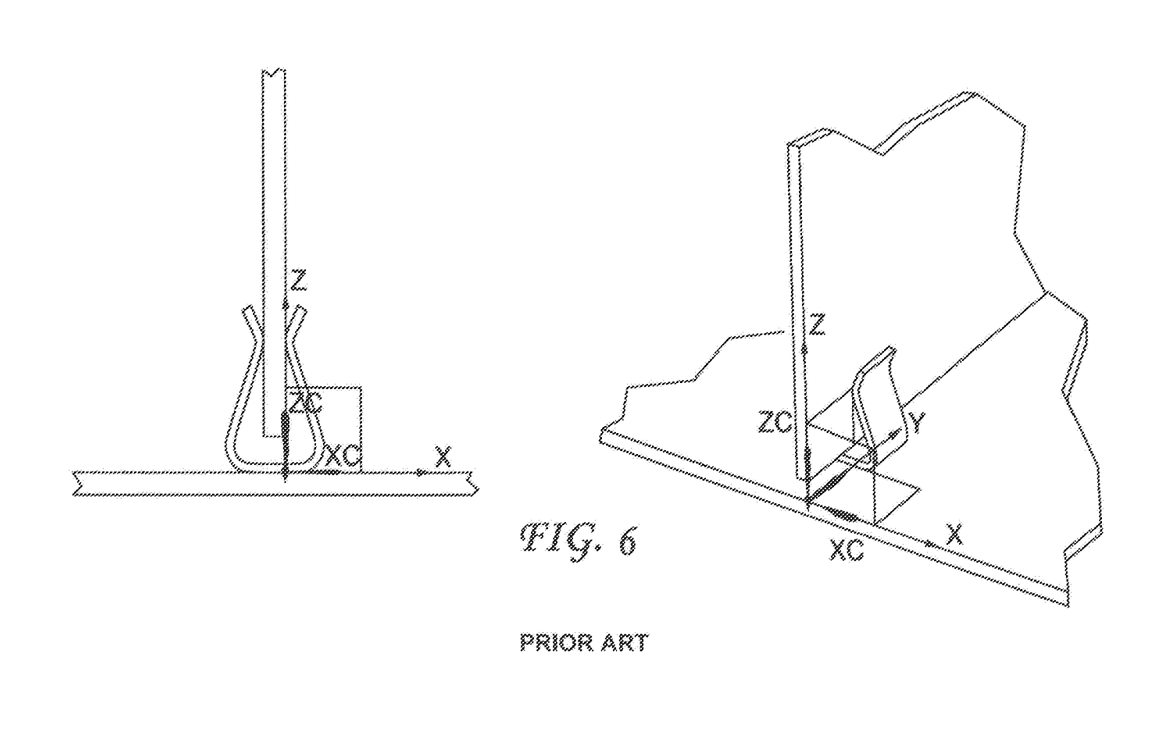
FIG. 6 shows two circuit boards that are perpendicular to each other and which are interconnected by one or more U-shaped metal clips.

FIG. 6 shows two circuit boards that are perpendicular to each other and which are interconnected by one or more U-shaped metal clips. The clips include a planar baseplate to be soldered onto the horizontal circuit board signal pad or ground pad, and two arms bent in a way to provide a spring effect and thus to make the U-shaped ends come in contact with the vertical circuit board. Despite the low cost offered by this solution, its disadvantage is a minimum of two clips are required, one clip to transmit the signal and a second clip to transmit the ground between the two circuit boards. Also, since the distance between signal and ground clips must be accurately ensured, low cost processes are incompatible with this solution.

SUMMARY

The proposed apparatus is directed to a metal part that enables the interconnection of two circuit boards (PCBs) arranged at an angle to one another, for example, perpendicularly. The proposed apparatus aims to transmit a radio frequency (RF) signal in a wide frequency range, addressing for instance WLAN applications in both the 2.4 GHZ and 5 GHz bands of the IEEE. 802.11a/b/g/n/ac standard.

The proposed interconnection device (apparatus) has been designed in the framework of the development of small size set-top-boxes (STB) which integration constraints require the use of several circuits boards (e.g., printed circuit boards (PCBs)) interconnected with each other. The proposed interconnection apparatus (device) is described in terms of a set top box, but is not so limited, and may include gateways, smart home devices, home networking device or any other electronic device that has circuit boards that must be interconnected in such a manner as to couple a first transmission signal on a first circuit board with a third transmission signal on a second circuit board.

The proposed interconnection device (apparatus) offers an interconnection solution that sets out to address the above described disadvantages of conventional solutions. In a particular embodiment the proposed interconnection device (apparatus) includes a surface mountable single metal clip capable of interconnecting the radio frequency signals from a first circuit board and a second circuit board and the grounding signal from a board-to-board interconnection.

A radio frequency interconnection device is described including a first part of the radio frequency interconnection device being disposed on a first circuit board and a second part of the radio frequency interconnection device disposed on a second circuit board.

The first part of the radio frequency interconnection device includes a first transmission line connected to ground at a first I/O port. It should be noted that the first transmission line and second transmission line may be a micro-strip line, a strip-line, a coplanar line or a multilayer line. In the description herein micro-strip line will be used as an example and should not be taken as limiting. Micro-strip line and transmission line may also be used interchangeably in the description herein. The first transmission line is connected to an intermediate terminating pad, the intermediate terminating pad being spaced apart from a first grounding pad and a second transmission line is connected to the first transmission line. The second part of the radio frequency interconnection device includes a third micro-strip line that is a U-shape connected to a second grounding pad. The second grounding pad is located directly above the first grounding pad. The third micro-strip line is also connected to an output line at an intersection point.

The first part of the radio frequency interconnection device is attached to the second part of the radio frequency interconnection device with two baseplates. A first baseplate being between the first grounding pad and the second grounding pad and a second baseplate being between the intersection point and the intermediate terminating pad. The baseplates provide an air gap between the first circuit board and the second circuit board. Both the first circuit board and the second circuit board have a ground plane.

Figure 9:
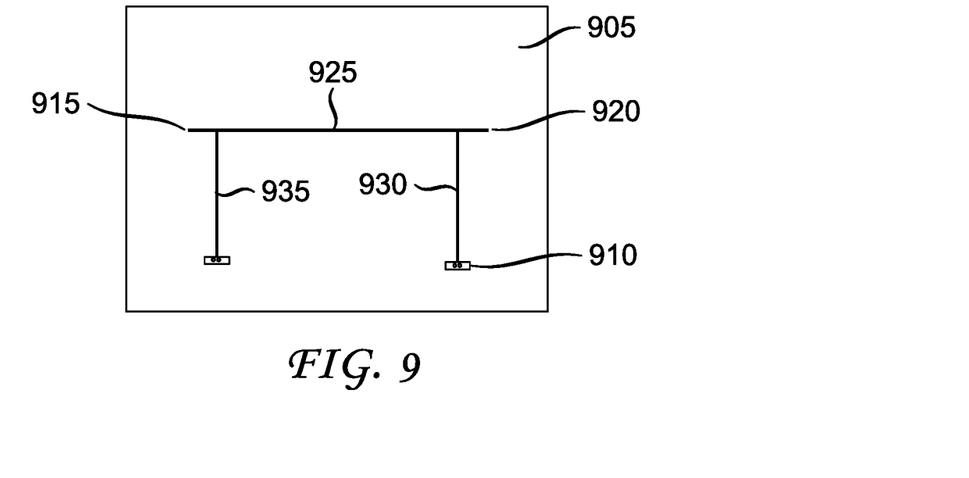
FIG. 9 illustrates an exemplary symmetric radio frequency wideband bandpass filter in accordance with embodiments of the invention.

The first transmission line 925 is about half-wavelength long and may be straight or meandering. The second transmission line 935 is about quarter-wavelength long and may be straight or meandering The first circuit board and the second circuit board are orthogonal to each other. The first circuit board may be horizontal and the second circuit board may be vertical or the first circuit board may be vertical and the second circuit board may be horizontal.

The intermediate terminating pad is spaced apart from the first grounding pad by between 100 and 200 μm.

At an output port of the second circuit board, a shunt element (short circuit stub line) enables an interconnection between the first circuit board and the second circuit board. From the input port to the output port the circuit exhibits a bandpass type filtering response.

An electronic device includes a plurality of circuit boards any pair of which are interconnected using a radio frequency interconnection device according to any the above.

BRIEF DESCRIPTION OF THE DRAWINGS

The proposed method and apparatus is best understood from the following detailed description when read in conjunction with the accompanying drawings. The drawings include the following figures briefly described below.

It should be understood that the drawing(s) are for purposes of illustrating the concepts of the disclosure and is not necessarily the only possible configuration for illustrating the disclosure.

DETAILED DESCRIPTION

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The proposed interconnection device (apparatus) is described below step by step from the origin of the idea to the application to an example of realization.

Figure 7:
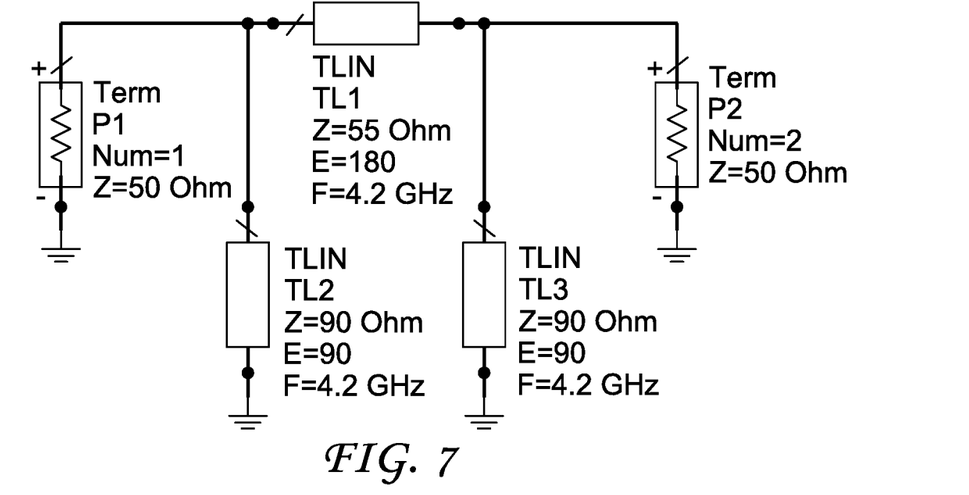
FIG. 7 is an exemplary design of a symmetric radio frequency wideband bandpass filter in accordance with the embodiments of the invention.

FIG. 7 is an exemplary design of a symmetric radio frequency wideband bandpass filter in accordance with the principles of the proposed apparatus. The symmetric radio frequency wideband bandpass filter of FIG. 7 includes three theoretical transmission lines TLIN, one (TL1) connected to the input (P1) and output (P2) ports and the two other lines (TL2, TL3) connected to the ground at their respective I/O ports. For each TLIN, Z is defined as the characteristic impedance of the line, E is defined as the electrical length (in degrees) and F is defined as the related frequency.

Figure 8:
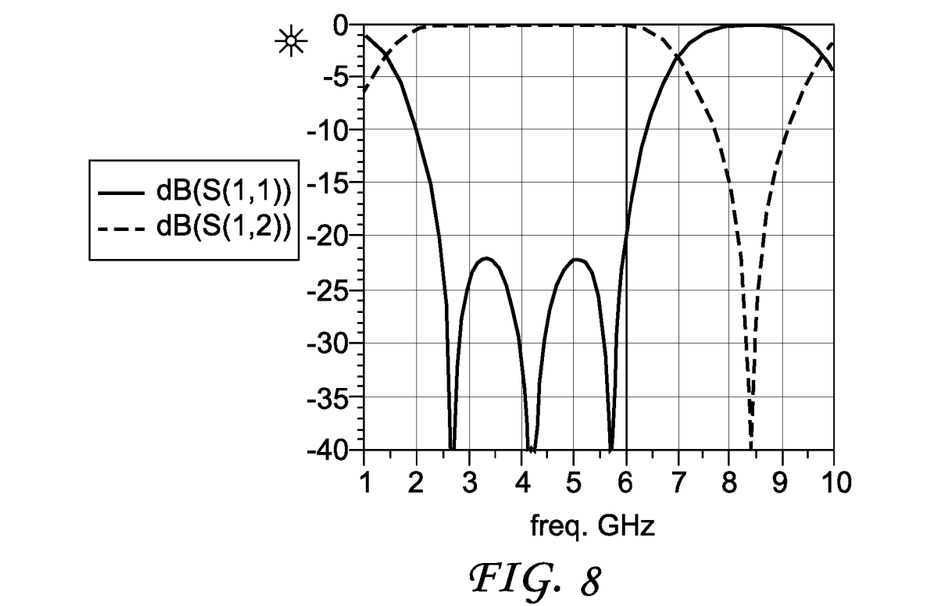
FIG. 8 shows the filter response for the exemplary symmetric radio frequency wideband bandpass filter of FIG. 7.

FIG. 8 shows the filter response for the exemplary symmetric radio frequency wideband bandpass filter of FIG. 7. With the values of the design of the symmetric radio frequency wideband bandpass filter as shown in FIG. 7 and described above, the filter responses are plotted in FIG. 8, showing a wide passing band (dB(S12)) from 2-6 GHz, with low reflection coefficient (dB(S11)<−20 dB). This is in the ideal case.

FIG. 9 illustrates an exemplary symmetric radio frequency wideband bandpass filter in accordance with the principles of the proposed apparatus when it is provided on a planar board. Using micro-strip lines printed onto a low-cost fiberglass reinforced epoxy (FR4) based multilayer substrate, results in the circuit presented in FIG. 9, with first transmission line 925 (TL1) length at around 20 mm, i.e. half-wavelength at 4 GHz. First transmission line 925 (TL1) is connected to input port 915 (P1) and output port 920 (P2). Second transmission line 935 (TL2) is connected to first transmission line 925 (TL1). Third transmission line 930 (TL3) is also connected to first transmission line 925 (TL1). Third transmission line 930 (TL3) terminates in grounded via-hole 910. Transmission lines 935 (TL2) and 930 (TL3) are shunt elements (and are also called short circuit stub lines). Straight lines are used here, but, of course, the lines can meander in order to significantly compact the design.

Figure 10:
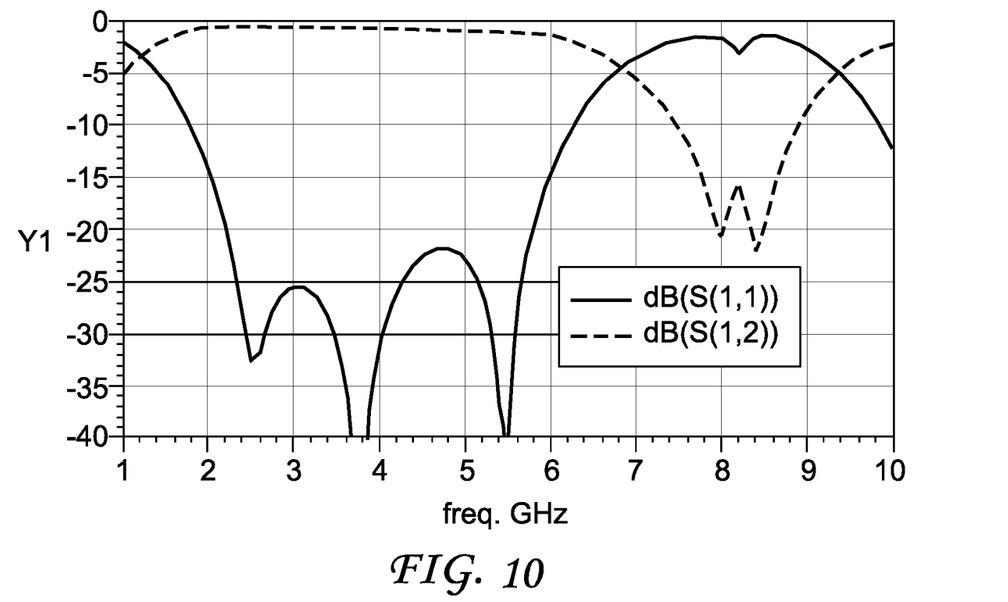
FIG. 10 shows the behavior for the exemplary symmetric radio frequency wideband bandpass filter of FIG. 9.

FIG. 10 shows the behavior for the exemplary symmetric radio frequency wideband bandpass filter of FIG. 9. With the filter shown in FIG. 9 and described above, the behavior shown in FIG. 10 is close to the behavior of the ideal filter of FIG. 7, with naturally higher insertion loss (due to mainly to the high dielectric loss of the FR4 substrate, Df~0.02).

From the above described single horizontal planar filter, it is possible to consider placing a portion of the filter network in a second plane, for instance, onto a vertical circuit board. The proposed interconnection device (apparatus) includes placing the shunt element (short circuit stub line) TL3 on the vertical circuit board to provide the interconnection between the two circuit boards using only a single metal part disposed on two perpendicular circuit boards.

Figure 11:
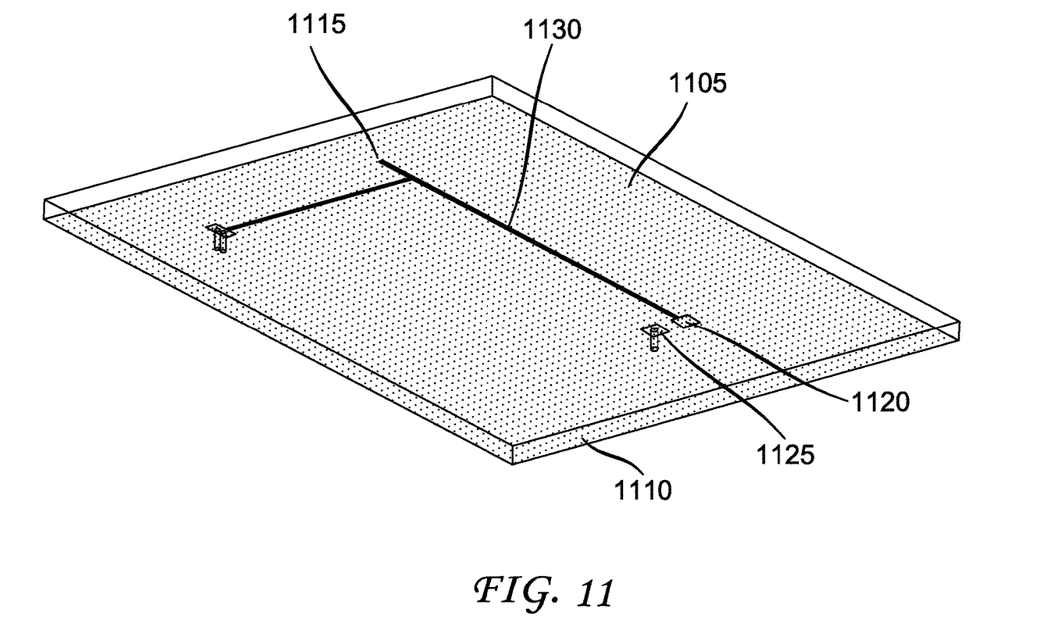
FIG. 11 shows a first portion of the exemplary symmetric radio frequency wideband bandpass filter. The first portion does not include TL3 or the output line.

FIG. 11 shows a first portion of the exemplary symmetric radio frequency wideband bandpass filter. The first portion of the exemplary symmetric radio frequency wideband bandpass filter is disposed on a first circuit board 1105 having a ground plane 1110. Input port 1115 is connected to first transmission line 1130 (TL1). First transmission line 1130 (TL1) of the filter terminates in intermediate terminating pad 1120 (P2$i$). Grounding pad 1125 (PG1) is spaced apart from intermediate terminating pad 1120 (P2$i$). The first part of the filter on the first circuit board may be realized using other transmission lines such as strip-lines, coplanar lines, multilayer lines as well as micro-strip lines subject to the constraint that grounding pad 1125 and intermediate terminating pad 1120 are printed on the top layer of the first circuit board. The first portion does not include TL3 or the output line. The distance between PG1 and P2$i$ is in the range of 100-200 μm depending on the frequency range of operation.

Figure 12:
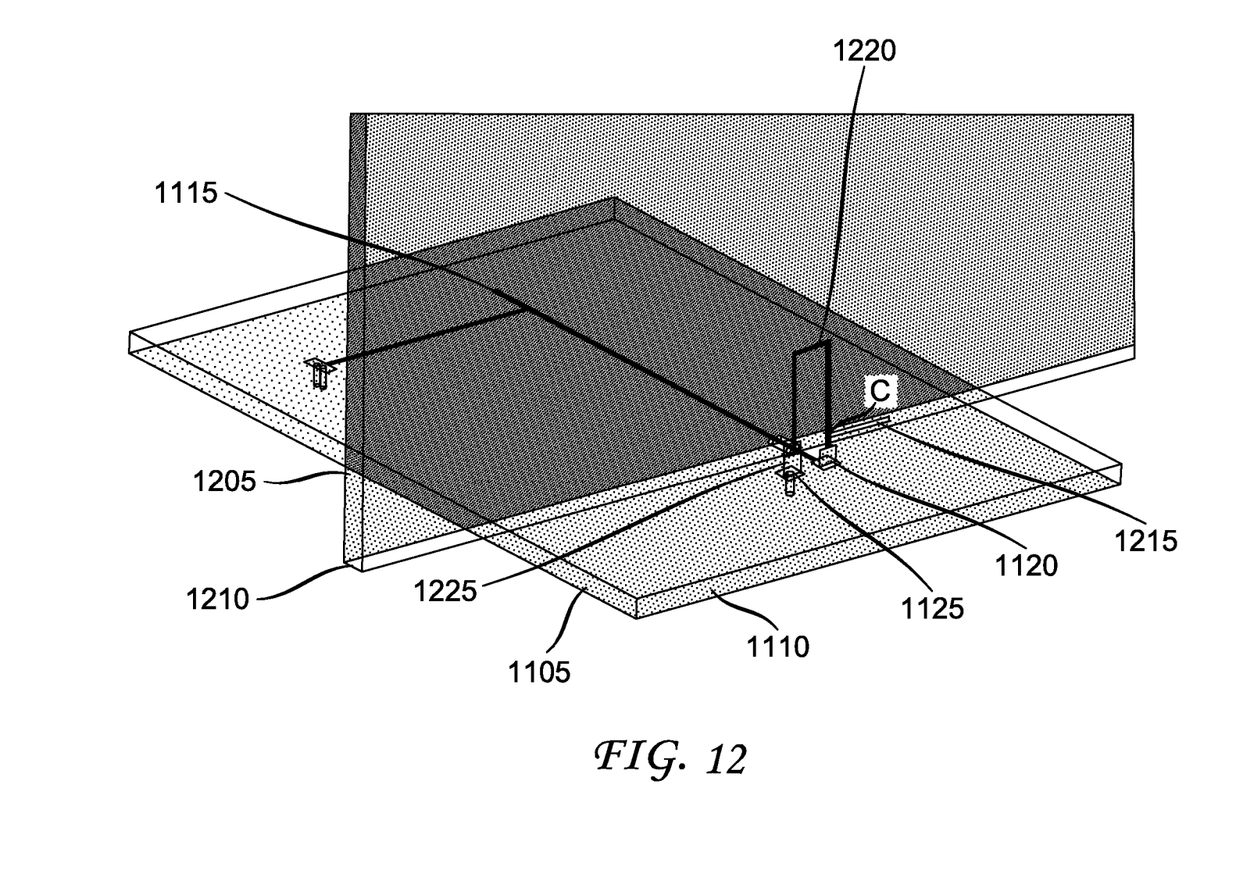
FIG. 12 shows the second (remaining) portion of the exemplary symmetric radio frequency wideband bandpass filter including TL3 and the output line and on a second circuit board.

FIG. 12 shows the second (remaining) portion of the exemplary symmetric radio frequency wideband bandpass filter including TL3 and the output line on a second circuit board, the second circuit board being orthogonal to the first circuit board. TL3 is formed in an inverted narrow U-shape so that coming from the intermediate terminating pad P2$i$ it returns to the ground pad PG1. On the second circuit board, TL3 is in contact with the output port P2 at an intersection point C and with a ground pad PG2 located above PG1. The elements of the first circuit board are indicated with the same reference indicia as on FIG. 11 and will not be described again. The second circuit board 1205 has a ground plane 1210. Third transmission line 1220 (TL3) is a shunt element (short circuit stub line). It should be noted that third transmission line 1220 (TL3) may be another shape than an inverted U-shape as described above provided that connections 1125, 1120, 1225 and C are ensured. Output port 1215 (P2) is in contact with third transmission line 1220 (TL3) at intersection point C. Grounding pad 1225 (PG2) is located above grounding pad 1125 (PG1).

Any kind of filter circuit may be applied provided the circuit contains, at the output port, a short-circuit stub line (shunt element) (TL3) that enables realization of the interconnection with the perpendicular circuit board (e.g., printed circuit board (PCB)).

Figure 13:
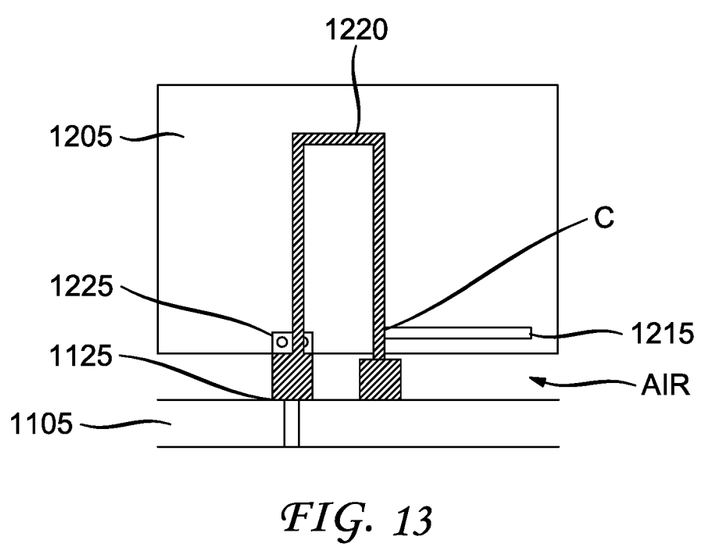
FIG. 13 shows a close-up sectional view of the interconnection between orthogonal circuit boards using an embodiment of the proposed apparatus, with an air gap separating the circuit boards in order to avoid a short-circuit.
Figure 14:
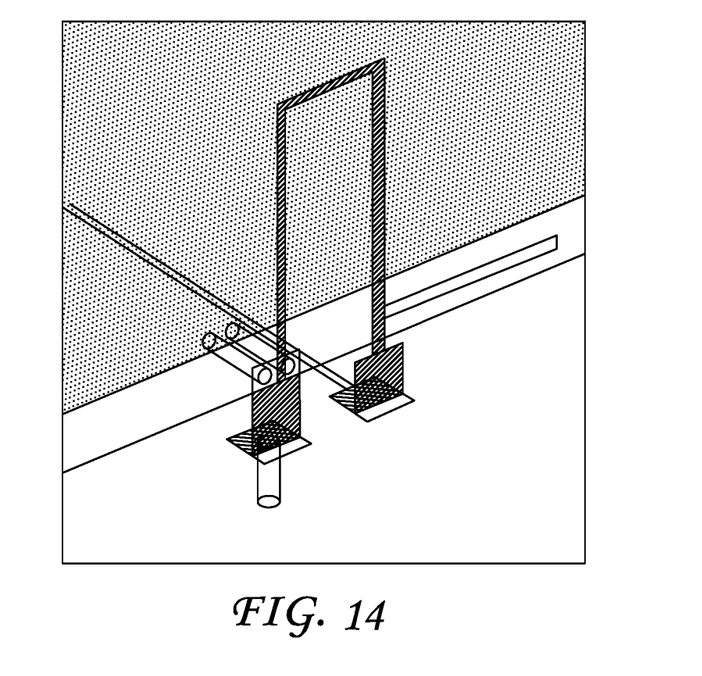
FIG. 14 shows an embodiment of the proposed interconnection device (apparatus), wherein TL3 can be considered to be a single metal part with two baseplates (on two circuit boards).

FIG. 13 shows a close-up sectional view of the interconnection between the first and second orthogonal circuit boards using an embodiment of the proposed apparatus, with an air gap separating the first and second circuit boards in order to avoid a short-circuit. TL3 can now be considered as a single metal part with two baseplates soldered to the respective pads PG1 and P2i printed on the first circuit board, as illustrated in FIG. 14, which shows the proposed interconnection device (apparatus), wherein TL3 can be considered a single metal part with two baseplates (on two circuit boards) perpendicular to each other. The various elements of FIG. 13 are labeled with the same reference indicia as used to label the elements in FIGS. 11 and 12. At this point, TL3 should be considered as an electrical model designed to prove the concept. High volume realization methods are described below.

Figure 15:
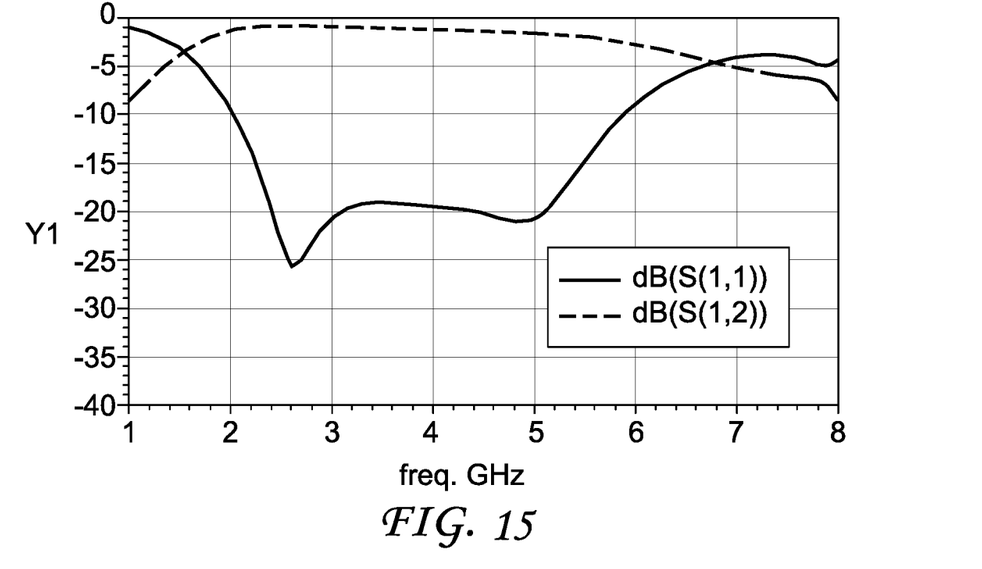
FIG. 15 shows the response and performance of an embodiment of the proposed interconnection device (apparatus).

The entire circuit as described above and shown in FIG. 12 has been simulated using a 3D electromagnetic simulation tool as proof-of-concept. FIG. 15 shows the response and performance of the proposed interconnection device (apparatus). As can be seen from FIG. 15 the response and performance are similar to a uni-planar filter (FIG. 10). The achieved performances in term of bandwidth enable the proposed interconnection device (apparatus) to be applied to dual-band WLAN applications, up to 6 GHz.

Figure 16:
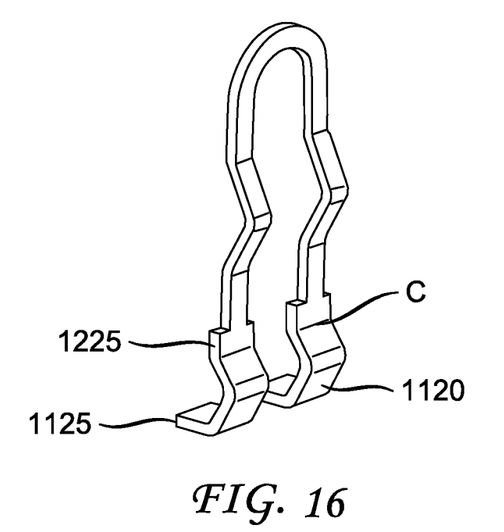
FIG. 16 is an exemplary embodiment of the proposed interconnection device (apparatus).

The proposed interconnection device (apparatus) can be fabricated using a well-known stamping process and there are several ways to interconnect the different pins to the circuit board and to the metal plate. One such fabrication of the proposed interconnection device (apparatus) is illustrated in FIG. 16, where curved strips are introduced in order provide the requested flexibility to ensure the contact with grounding pad 1225 (PG2) and intersection point C disposed on the second circuit board. Grounding pad 1125 (PG1) and intermediate terminating pad 1120 (P2i) are disposed on the first circuit board.

Figure 17:
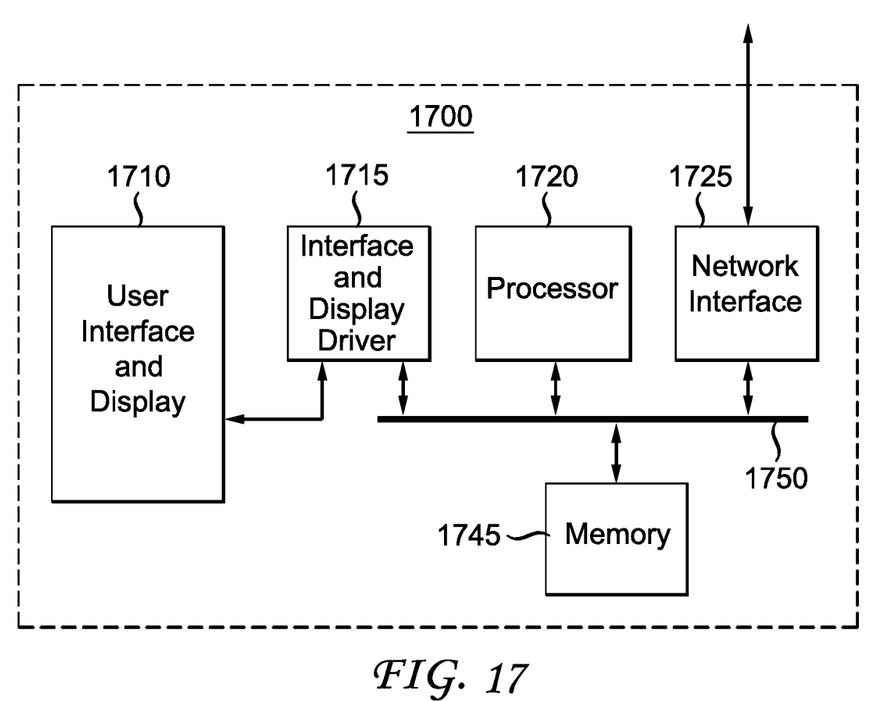
FIG. 17 is a block diagram of a media device such as a set top box.

FIG. 17 is an example block diagram of the media device 1700 of FIG. 2. A media device is an electronic device such as, but not limited to, a set top box. The block diagram configuration includes a bus-oriented 1750 configuration interconnecting a processor 1720, and a memory 1745. The configuration of FIG. 17 also includes a network interface 1705 and may include either a wired or a wireless interface or both.

Processor 1720 provides computation functions for the media device, such as the one depicted in FIG. 2. The processor 1720 can be any form of CPU or controller that utilizes communications between elements of the media device to control communication and computation processes. Those of skill in the art recognize that bus 1750 provides a communication path between the various elements of embodiment 1700 and that other point-to-point interconnection options (e.g. non-bus architecture) are also feasible.

User interface and display 1710 is driven by interface circuit 1715. The interface 1710 is used as a multimedia interface having both audio and video capability to display streamed or downloaded audio and/or video and/or multimedia content obtained via network interface 1725 and connection 1705 to a network.

Memory 1745 can act as a repository for memory related to any of the methods that incorporate the functionality of the media device. Memory 1745 can provide the repository for storage of information such as program memory, downloads, uploads, or scratchpad calculations as well as the storage of streamed or downloaded content including audio, video and multimedia content. Those of skill in the art will recognize that memory 1745 may be incorporated all or in part of processor 1720. Network interface 1725 has both receiver and transmitter elements for communication as known to those of skill in the art.

Network interface 1725 may include a wireless interface to communicate wirelessly to transmit requests for audio and/or video and/or multimedia content and receive the requested audio and/or video and/or multimedia content. In order to do so, a radio frequency interface may be provided. The radio frequency interface transmits and receives using an antenna, which may use a radio frequency wideband bandpass filter. The radio frequency wideband bandpass filter circuit may be split across two circuit boards, which are orthogonal to each other. The orthogonal circuit boards may use the interconnection device depicted in FIGS. 12 and 13 and described above.

Any other filter networks terminated by a shunt (short circuit stub line) transmission line, such as the example considered herein, can use the proposed interconnection device.

It is to be understood that the proposed method and apparatus may be implemented in various forms of hardware, software, firmware, special purpose processors, or a combination thereof. Special purpose processors may include application specific integrated circuits (ASICs), reduced instruction set computers (RISCs) and/or field programmable gate arrays (FPGAs). Preferably, the proposed method and apparatus is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein, the phrase "coupled" is defined to mean directly connected to or indirectly connected with through one or more intermediate components. Such intermediate components may include both hardware and software based components.

It is to be further understood that, because some of the constituent system components and method steps depicted in the accompanying figures are preferably implemented in software, the actual connections between the system components (or the process steps) may differ depending upon the manner in which the proposed method and apparatus is programmed. Given the teachings herein, one of ordinary skill in the related art will be able to contemplate these and similar implementations or configurations of the proposed method and apparatus.

For purposes of this application and the claims, using the exemplary phrase "at least one of A, B and C," the phrase means "only A, or only B, or only C, or any combination of A, B and C."

The invention claimed is:

1. An interconnection system, comprising:
a first printed circuit board;
a second printed circuit board, wherein the first printed circuit board comprises a first portion of a bandpass filter, wherein the bandpass filter is configured to communicate a signal between the first printed circuit board and the second printed circuit board; and
a metal clip formed of curved strips configured to couple the signal between the first printed circuit board and the second printed circuit board, the second printed circuit board being oriented at an angle with respect to the first printed circuit board.

2. The interconnection system according to claim 1, wherein said angle is a right angle.

3. The interconnection system according to claim 1, wherein said bandpass filter is a symmetric radio frequency wideband bandpass filter.

4. The interconnection system according to claim 1, wherein said metal clip provides a coupling using two electrical interface connections.

5. The interconnection system according to claim 4, wherein one of said two electrical interface connections is for said signal.

6. The interconnection system according to claim 1, wherein said angle is an acute angle.

7. The interconnection system according to claim 1,
wherein said first printed circuit board comprises a first transmission line connected to a first I/O port, and
wherein said first transmission line is terminated in an intermediate terminating pad, said intermediate terminating pad being spaced apart from a first grounding pad.

8. The interconnection system according to claim 7, wherein said first transmission line is one of a micro-strip line, a coplanar line, a strip-line or a multilayer line and wherein said second transmission line is one of a micro-strip line, a coplanar line, a strip-line or a multilayer line and wherein said first grounding pad and said intermediate terminating pad are printed on an outer surface of said first circuit board.

9. The interconnection system according to claim 7, wherein a distance between said intermediate terminating pad and said first grounding pad is between 100 and 200 μm.

10. The interconnection system according to claim 7,
wherein said second printed circuit board comprises a third transmission line that is connected to a second grounding pad, said second grounding pad located directly above said first grounding pad, said third transmission line also connected to an output line at an intersection point,
wherein said third transmission line is a micro-strip line.

11. The interconnection system according to claim 7, wherein said first transmission line is about one half-wavelength long.

12. The interconnection system according to claim 7, wherein said first transmission line is straight.

13. The interconnection system according to claim 7, wherein said first transmission line is meandering.

14. An electronic device, comprising:
at least two printed circuit boards, the at least two printed circuit boards comprising a first printed circuit board and a second printed circuit board, the first printed circuit board comprising a first portion of a bandpass filter, wherein the bandpass filter is configured to communicate a signal between the first printed circuit board and the second printed circuit board, the second printed circuit board being oriented at an angle with respect to the first printed circuit board; and
a metal clip formed of curved strips, the metal clip being configured to couple the signal between the first printed circuit board and the second printed circuit board.

15. The electronic device according to claim 14, wherein said bandpass filter is a symmetric radio frequency wideband bandpass filter.

16. The electronic device according to claim 14, wherein said metal clip provides a coupling using two electrical interface connections.

17. The electronic device according to claim 16, wherein one of said two electrical interface connections is for said signal.

18. The electronic device according to claim 14, wherein said angle is an acute angle.

19. The electronic device according to claim 14, wherein said angle is a right angle.

20. The electronic device according to claim 14,
wherein said first printed circuit board comprises a first transmission line connected to a first I/O port, and
wherein said first transmission line is terminated in an intermediate terminating pad, said intermediate terminating pad being spaced apart from a first grounding pad.

21. The electronic device according to claim 20,
wherein said second printed circuit board comprises a third transmission line that is connected to a second grounding pad, said second grounding pad located directly above said first grounding pad, said third transmission line also connected to an output line at an intersection point,
wherein said third transmission line is a micro-strip line.

22. The electronic device according to claim 20, wherein said first transmission line is about one half-wavelength long.

23. The electronic device according to claim 20, wherein said first transmission line is straight.

24. The electronic device according to claim 20, wherein said first transmission line is meandering.

25. The electronic device according to claim 20, wherein a distance between said intermediate terminating pad and said first grounding pad is between 100 and 200 μm.

26. The electronic device according to claim 20, wherein said first transmission line is one of a micro-strip line, a coplanar line, a strip-line or a multilayer line and wherein said second transmission line is one of a micro-strip line, a coplanar line, a strip-line or a multilayer line and wherein said first grounding pad and said intermediate terminating pad are printed on an outer surface of said first circuit board.

* * * * *